US006993468B2

(12) United States Patent
Harriman et al.

(10) Patent No.: US 6,993,468 B2
(45) Date of Patent: Jan. 31, 2006

(54) RECOGNIZING SIGNALS IN DESIGN SIMULATION

(75) Inventors: David J. Harriman, Portland, OR (US); Arthur D. Hunter, Cameron Park, CA (US); Arvind B. Iyer, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 933 days.

(21) Appl. No.: 09/750,233

(22) Filed: Dec. 27, 2000

(65) Prior Publication Data

US 2002/0082817 A1 Jun. 27, 2002

(51) Int. Cl.
*G06F 17/50* (2006.01)

(52) U.S. Cl. .......................................... 703/14; 703/17

(58) Field of Classification Search .................. 703/17, 703/14; 710/105; 716/4
See application file for complete search history.

(56) References Cited

U.S. PATENT DOCUMENTS

| 5,175,829 | A | * | 12/1992 | Stumpf et al. | ............... 712/203 |
| 5,479,355 | A | * | 12/1995 | Hyduke | ....................... 703/14 |
| 6,684,226 | B1 | * | 1/2004 | Bodilsen | ....................... 707/203 |

* cited by examiner

*Primary Examiner*—Leo Picard
*Assistant Examiner*—Carlos Ortiz Rodriguez
(74) *Attorney, Agent, or Firm*—Kacvinsky LLC

(57) ABSTRACT

A transaction rule is used to recognize a set of simulation signals obtained from a design simulation as a transaction. An action associated with the transaction rule is executed to produce an output identifying the transaction.

27 Claims, 6 Drawing Sheets

Table of Rules and Actions

| Rule | Production | Action |
|---|---|---|
| DMread | DUcmd UMcmd MUdata UDdata | DMread_act() |
| MUdata | MUdxfer MUdxfer | MUdata_act() |
| UDdata | UDdxfer | UDdata_act(1) |
| UDdata | UDdata UDdxfer | UDdata_act(2) |
| DUcmd | (DUcavail=1) AND (UDcget=1) | DUcmd_act() |
| UMcmd | (UMcavail=1) AND (MUcget=1) | UMcmd_act() |
| MUdxfer | (MUdavail=1) AND (UMdget=1) | MUdxfer_act() |
| UDdxfer | (UDdavail=1) AND (DUdget=1) | UDdxfer_act() |

FIG. 2

Table of Partial Signal Event List

| Time (ns) | Events | Rule |
|---|---|---|
| 15 | DUcavail=0, UDcget=0, UMcavail=0, MUcget=1, MUdavail=0, UMdget=1, UDdavail=0, DUdget=0 | |
| 25 | DUcavail=1, DUaddr=0x432B, DUop=0, DUlen=1 | |
| 30 | clock =1 | |
| 35 | UDcget=1, clock=0 | |
| 40 | clock=1 | DUcmd |
| 54 | UMcavial=1, UMaddr=0x432B, UMop=0 | |
| 60 | clock=1 | UMcmd |
| 87 | MUdavail=1, MUdata=0x6C45FB19 | |
| 90 | clock=1 | MUdxfer |
| 93 | MUdata=0x28EB38DC | |
| 100 | clock=1 | MUdxfer, MUdata |
| 105 | UDdavail=1, UDdata=0x6C45 | |
| 110 | clock=1 | |
| 117 | DUdget=1 | |
| 120 | clock=1 | UDdxfer, UDdata(1) |
| 125 | UDdata=0xFB19 | |
| 130 | clock=1 | UDxfer, UDdata(2), DMRead |

FIG. 3

STACK

| Time 40 | Time 60 | Time 90 | Time 100 | Time 100 |
|---------|---------|---------|----------|----------|
| DUcmd   | UMcmd   | MUdxfer | MUdxfer  | MUdata   |
|         | DUcmd   | UMcmd   | MUdxfer  | UMcmd    |
|         |         | DUcmd   | UMcmd    | DUcmd    |
|         |         |         | DUcmd    |          |
|         |         |         |          |          |

| Time 120 | Time 120 | Time 130 | Time 130 | Time 140 |
|----------|----------|----------|----------|----------|
| UDdxfer  | UDdata   | UDdxfer  | UDdata   | DMRead   |
| MUdata   | MUdata   | UDdata   | MUdata   |          |
| UMcmd    | UMcmd    | MUdata   | UMcmd    |          |
| DUcmd    | DUcmd    | UMcmd    | DUcmd    |          |
|          |          | DUcmd    |          |          |

FIG. 4

RECOGNIZING SIGNALS IN DESIGN SIMULATION

BACKGROUND

The invention relates to recognizing signals in design simulation.

To determine whether a hardware or a system design will perform as intended, the design is often simulated to produce simulated signals. Specific sets of the simulated signals make up transactions or protocols. A transaction is a set of signals that indicate a unit of interactions such as a read or write operation. A protocol refers to signals that define rules of data transmission.

Simulated transactions or protocols conventionally are verified either by producing specific signal events and data during the simulation, which is time-consuming, or using an unstructured ad-hoc post-processing program on the simulation output. Simulations of lower-level designs are not easily extendible to higher-level designs, such as full-chip or system-level designs.

BRIEF DESCRIPTION OF THE DRAWINGS

FIG. 2 shows a table of rules and actions.
FIG. 3 shows a table of a partial signal event list.
FIG. 4 shows a time-evolving stack.

DETAILED DESCRIPTION

Figure 1:
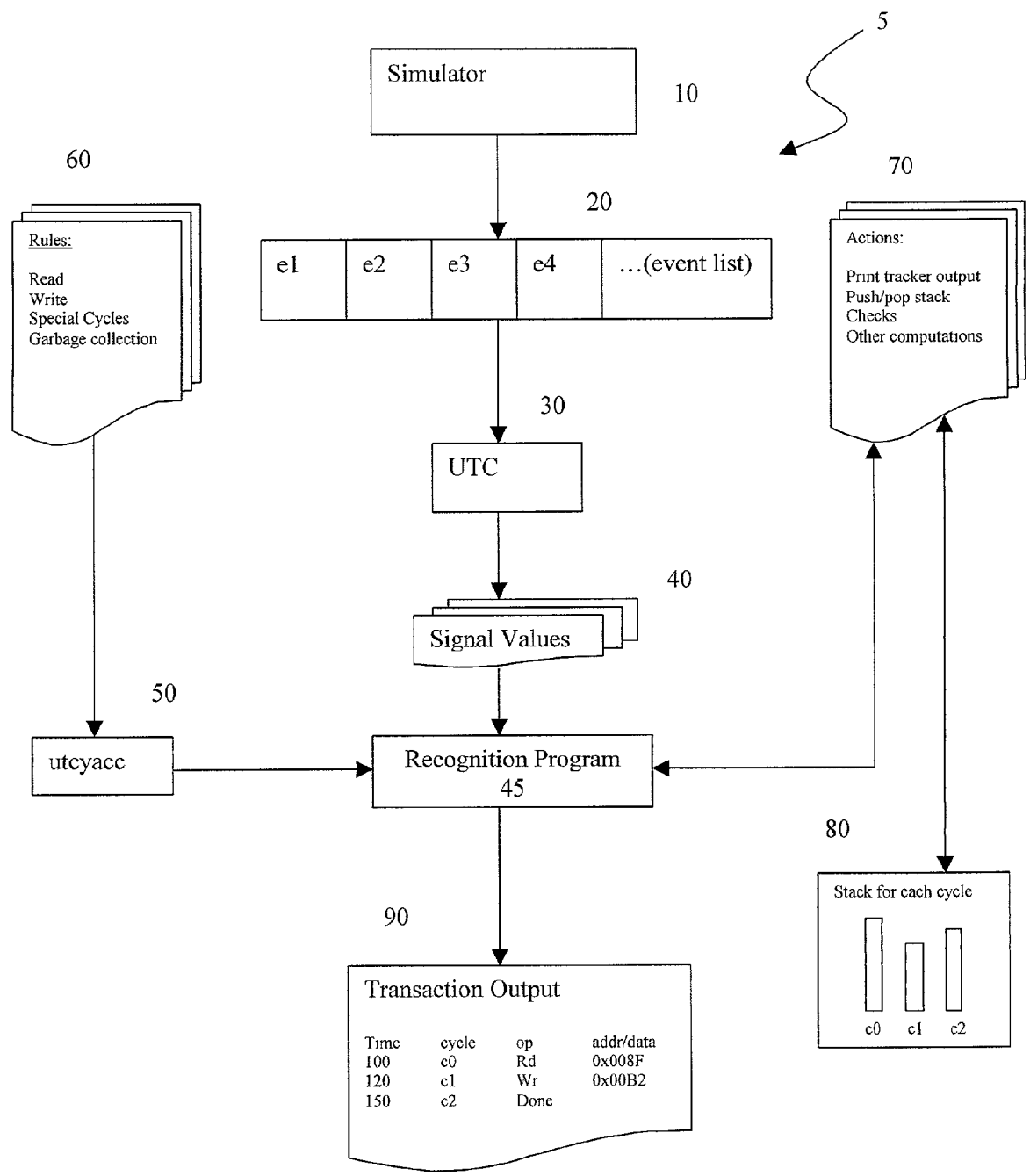
FIG. 1 shows a flow of tracking and checking transactions.

As shown in FIG. 1, a simulator 10 produces an event list file 20 which is a list of time-stamped signal events at the boundary of a design under test. The event list file 20 can be generated for every test by the simulator 10. The file 20 can be stored as character strings that are read from left to right.

A front-end reader called a unit tracker and checker (UTC) 30 reads the signal events and keeps track of the state of the events at each rising edge of a clock signal. Because signals are relevant at the clock rising edge for many logic circuit designs, the UTC 30 is configured to filter out signal events between clock cycles and to present the state of signal events at each clock rising edge as signal values 40. For example, assuming that the clock cycle is 10 nanoseconds (ns), if the signal event list shows that A=1 and B=1 at 121 ns and A=0 at 123 ns, the UTC 30 presents A=0 and B=1 at the clock rising edge at 130 ns.

The signal values 40 are read by a recognition program 45 generated by a unit tracker and checker yet another compiler compiler (UTCYACC) program 50. The UTCYACC program incorporates production rules 60, each of which is coupled to a corresponding action 70, into the program 45. The program 45 uses the production rules and the actions 70 to recognize transactions or protocols in the signal values 40.

The production rules 60 are formal languages comprising atomic rules. An atomic rule interprets a set of atomic signal events, each of which is an indivisible unit of interaction, for example, between devices. Atomic signal events are found in the event list file 20. The production rules 60 include "read transaction" and "write transaction."

Additionally, each production rule 60 is accompanied by an action 70, which is a set of tasks to be executed whenever the production rule applies. One such action 70 involves printing out a transaction output 90 which may contain such information as event time, cycle identification, transaction and event identification. The action 70 can further print out details of a transaction, such as operation code (opcode), length, address, byte enable, and data, and may indicate whether the transaction was completed successfully or whether errors were incurred. Additionally, the action 70 can perform coherency checks and compute user-defined values for later use.

At a clock rising edge, the action 70 manipulates the atomic rules extracted from the signal values 40 using a stack 80. Details of how the stack 80 are used to recognize a transaction are described below.

Figure 6:
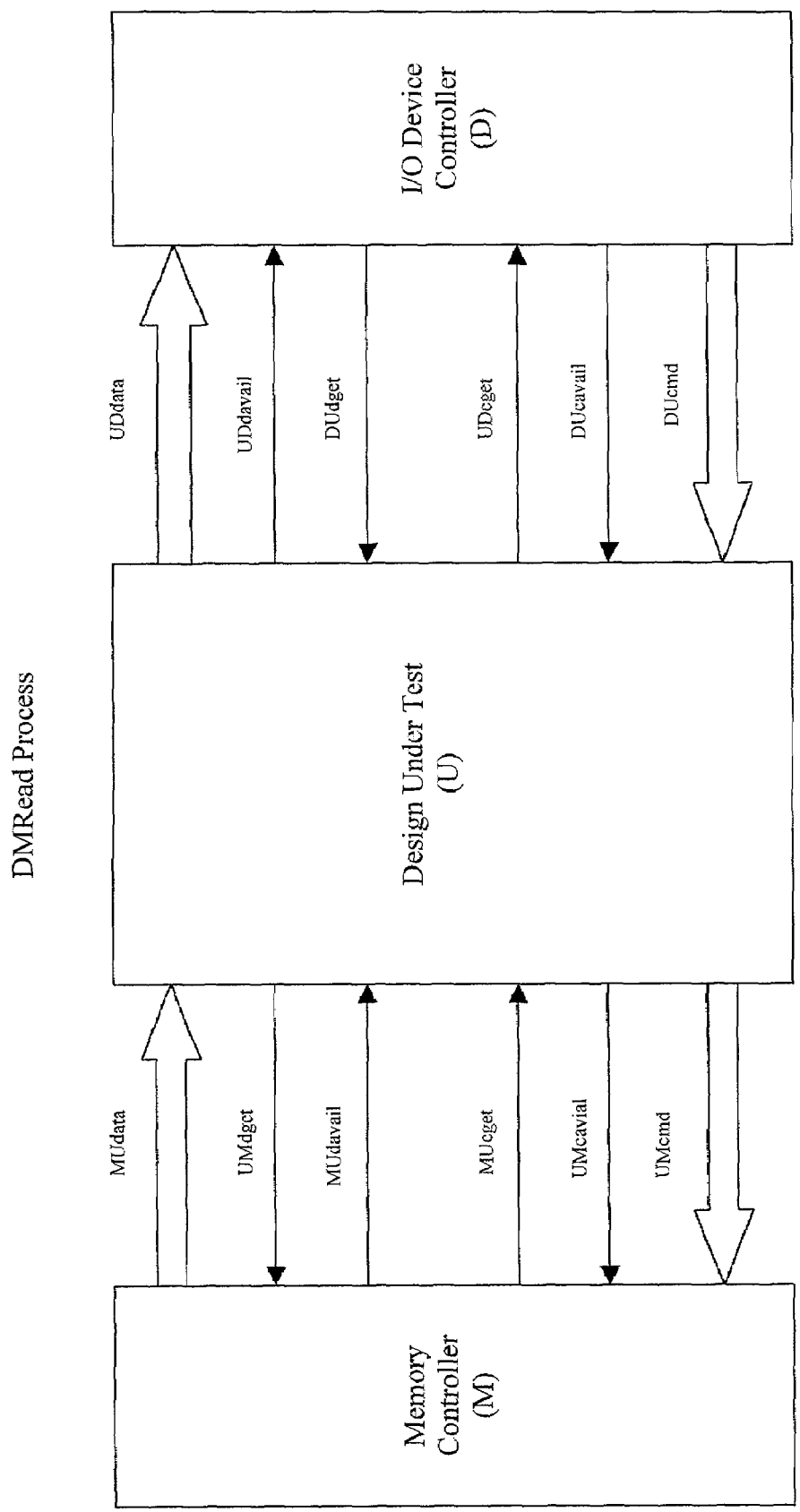
FIG. 6 illustrates a design simulation.

Context-independent formal languages are used to model a transaction. The formal languages are a set of rules that define the transaction successively until atomic signal events are obtained. For example, FIG. 6 shows a unit (U) subject to testing. One of the transactions that the unit (U) can perform is a read operation from an output/input device controller (D) to a memory controller (M). In the following discussion, such a read transaction is designated symbolically as DMRead.

The device controller (D) presents a read command (DUcmd) to the unit (U). After several clock cycles, the unit (U) presents a command (UMcmd) to the memory controller (M). The memory controller (M) responds to the unit (U) with data (MUdata) after several more clock cycles. Then, the unit (U) responds to the device controller (D) with the data (UDdata).

The read transaction rule can be written as follows:

DMRead :=DUcmd UMcmd MUdata UDdata.

The above rule includes a rule symbol (left-hand side) and production symbols (right-hand side). The rule is an example of a non-atomic rule that requires further definition. The device-to-unit read command, DUcmd, can be defined, for example, in terms of handshake signals, that is, atomic signal events, designated DUcavail and UDcget:

DUcmd :=(DUcavail=1) AND (UDcget=1).

As shown in FIG. 6, the handshake signal DUcavail is transmitted from the device controller (D) to the unit (U). The unit (U) responds by sending the handshake signal UDcget to the device controller (D). The device-to-unit command, DUcmd, including signals such as device address and opcode, is then sent to the unit (U). In other words, if the handshaking signals are detected, the command signals (DUcmd) are sent from the device controller (D) to the unit (U). No further breakdown of this rule is required because atomic signal events have been obtained. Therefore, the device-to-unit command, DUcmd, is an example of an atomic rule.

Similarly, the unit-to-memory command, UMcmd, can be defined as follows:

UMcmd :=(UMcavail=) AND (MUcget=1).

For the purpose of illustration, it is assumed that memory-to-unit data, MUdata, is transferred in two clock cycles and unit-to-device data, UDdata, is transferred in one to four clock cycles, depending on the data length. The memory-to-unit data, MUdata, and the unit-to-device data, UDdata, can be defined as follows:

MUdata :=MUdxfer MUdxfer,

UDdata :=UDdxfer, and

UDdata :=UDdata UDdxfer.

The MUdata rule specifies two data transfers. The two UDdata rules constitute a recursive definition and can specify any number of data transfers. The first UDdata is defined as one data transfer, and the second UDdata is defined as UDdata followed by a data transfer.

The non-atomic rules MUdxfer and UDdxfer can be defined as atomic rules using handshake signals as follows:

MUdxfer :=(MUdavail=1) AND (UMdget=1), and

UDdxfer :=(UDdavail=1) AND (DUdget=1).

The foregoing rules, along with corresponding actions, are summarized in FIG. 2.

The UTCYACC program 50 generates the recognition program 45, which applies the read transaction rules to the event list 20 generated by the simulator 10 to recognize the read transaction. The recognition program 45 is a stack-based engine that executes the user-defined action 70 that manipulates the stack 80 whenever the rule applies.

Figure 5:
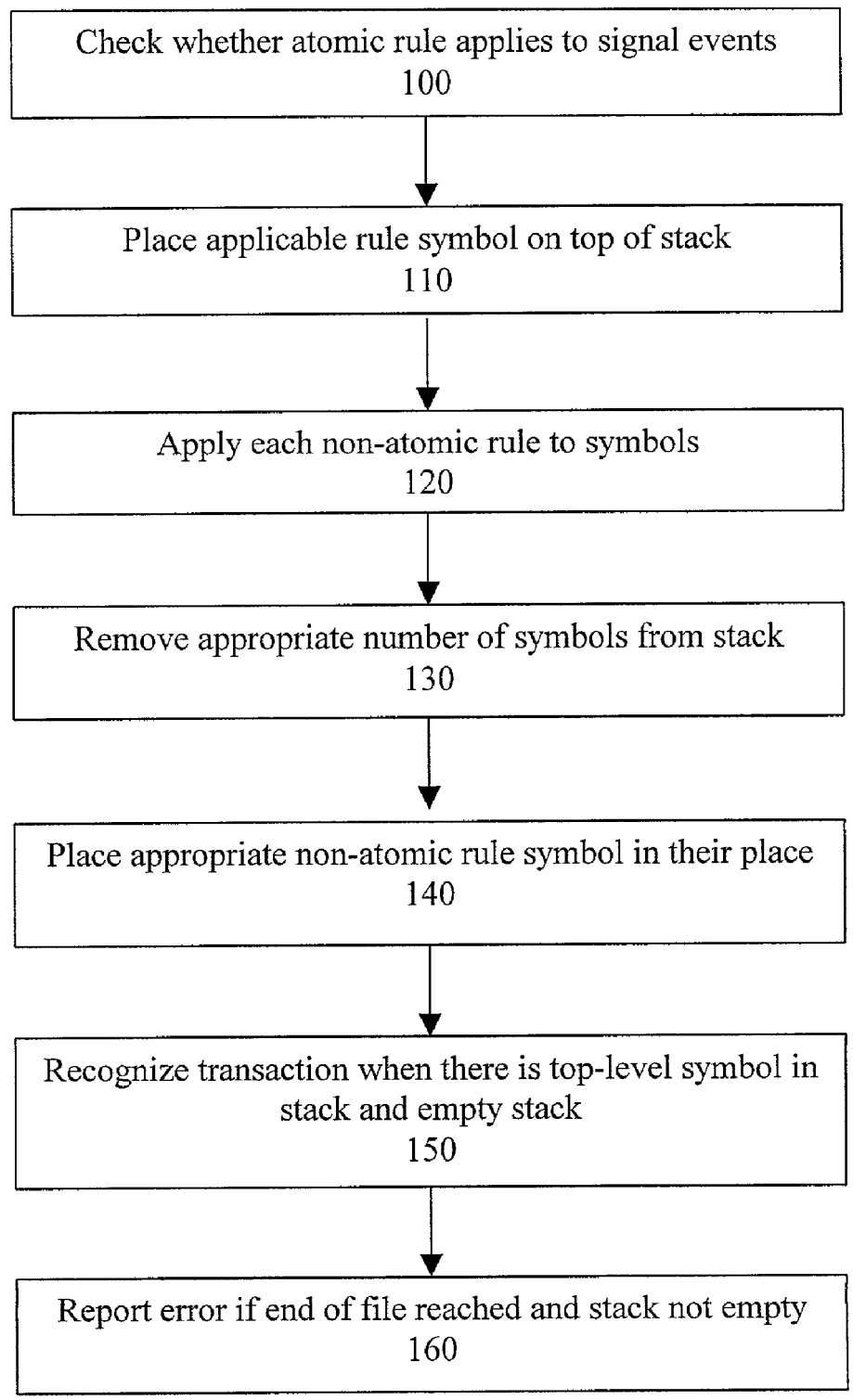
FIG. 5 illustrates how the stack is manipulated.

The manipulation of the stack 80 is shown in FIG. 5. The program 45 checks (100) whether each atomic rule applies to the signal events. If a particular rule applies, the program 45 places (110) the applicable rule symbol on top of the stack. A stack is a data structure for storing items that are to be accessed in last-in, first-out order.

The program 45 then reduces (120) the stack by applying the appropriate non-atomic rules. This involves comparing symbols on top of the stack to production symbols of the non-atomic rules. If the symbols on the stack match the production symbols (e.g. MUdxfer MUdxfer), the program 45 removes (130) the appropriate number of production symbols from the stack and pushes (140) the appropriate rule symbol (MUdata) onto the stack in their place.

When the stack contains a top-level symbol (e.g. DMRead), the transaction is recognized (150) and the stack is emptied.

If the end of the event list 20 is reached and the stack is not empty, the program 45 reports (160) that an error occurred and that the transaction was not completed.

FIG. 3 shows an example of a partial event list for a read transaction. The event list as shown is not filtered by the UTC 30. A clock period of 10 ns interval is assumed. FIG. 4 shows how the contents of the stack are modified according to the application of rules by the program 45 through this event list.

At time 40 ns, the program 45 recognizes the atomic events DUcavail=1 and UDcget=1 corresponding to DUcmd, and the command gets placed on top of the stack as shown in FIG. 4. At time 60 ns, another command (UMcmd) is recognized and is placed on top of the stack. At time 90 ns, a data transfer (MUdxfer) is recognized and is placed on the stack. At time 100 ns, a clock cycle later, another data transfer is recognized and is placed on top of the stack. The program 45 applies a non-atomic rule (see FIG. 2), removes MUdxfer MUdxfer from the stack and places MUdata on top of the stack.

At time 120 ns, a data transfer (UDdxfer) is recognized and placed on the stack. The non-atomic, first UDdata rule (see FIG. 2) is used to replace UDdxfer with UDdata. At time 130 ns, another UDdxfer is recognnized and is placed on the stack. The second UDdata rule (see FIG. 2) is applied to remove UDdxfer UDdata and to place UDdata on the stack. The program 45 then recognizes that the stacked symbols, UDdata MUdata UMcmd DUcmd, correspond to the transaction symbol DMRead and removes the symbols to place DMRead on top of the stack. Subsequently, DMRead is recognized as a top-level symbol, and the stack is emptied.

The functions of removing symbols from the stack and placing them on the stack are executed by the actions 70.

In addition to manipulating the stack 80, the actions 70 specify user-defined tasks. This includes printing useful signal values, performing coherency checks, and computing other values of interest. For example, the action, DUcmd_act ( ) can be coded to check if the transaction is a read command transfer, to obtain current stack/cycle identification for the transaction, to place DUcmd on the stack, to print cycle identification and signal values such as address, opcode and length, to compute the number of data transfers, and to increment the cycle identification for the next DUcmd event.

Similary, the action for UDdxfer can be coded to obtain current stack/cycle identification for the transaction, to count down the number of data transfers, to place UDdxfer on the stack, to print cycle identification and signal values, to check the data against what was obtained on the memory-to-unit data event, and to move to the next cycle if all data transfers are done.

The foregoing examples represent actions for atomic rules. Actions for a non-atomic rule, such as UDdata_act(n), can be coded to obtain current stack/cycle identification for the transaction, to remove n symbols from the stack and to place UDdata on the stack. Similary, the action for the non-atomic rule DMRead_act ( ) can be coded to obtain current stack/cycle identification for the transaction, to check to see that all unit-to-device data transfers are done, to remove four symbols from the stack and to print "Done" if the stack is empty.

Any non-empty stack is reported as an incomplete transaction and the contents of the stack are printed to indicate the events completed at that time.

The ordering of atomic rules can be important in some instances. For example, a DUcmd event occurs before a UMcmd event, and the rules should reflect this order. Similarly, non-atomic rules should be ordered to reduce the stack. For example, a DMRead rule should be applied after a DUdata rule is applied.

Some tests may have more than one instance of a transaction cycle. Each transaction can be tracked by using a separate stack that is uniquely identified by the cycle-identification. The cycle-identification is incremented when a new transaction begins. For example, two DUcmd events would imply that the second DUcmd should be assigned to the next stack.

If the design unit (U) also performs another transaction such as a write transaction, there should be separate rules and actions table for DMWrite. The UTCYACC program 50 can incorporte write transaction rules into the recognition program 45. Thus, the system would be reporting transaction events that they individually recognize.

If different transactions such as read or write transactions share the same signal events, such as DUcmd, then an opcode can be used to uniquely identify which transaction applies. An additional check on the opcode in the DUcmd rule can be implemented to address this type of situation.

To illustrate, it is assumed that there are two instances of read transaction with the event list below:

$DUcmd_1\ DUcmd_2\ UMcmd_2\ UMcmd_1\ \ldots$

The $UMcmd_2$ event for the second cycle occurs before the first and the recognition program 45 will incorrectly associate the $UMcmd_2$ event with the first stack. To address this situation, either an ordering algorithm can be implemented or the address bits can be used to identify the cycle uniquely.

Alternatively, the internal signals in the event list in addition to those at the boundary may be used in the rules or actions to distinguish the events.

The unit (U) may retry an event based on a preferred condition, such as a time-out. In that case, the retry condition should be part of the rules 60. Alternatively, the program 45, internal signals, or unique signal values can be used to detect retry events.

A transaction rule may be represented by different permutations of production symbols. For example, assume that a rule for DMWrite can be expressed as follows:

DMWrite :=DUcmd DUdata UMcmd UMdata.

It may be valid for the unit-to-memory command transfer to occur before any device-to-unit data transfer. Thus, the following rule is valid also:

DMWrite :=DUcmd UMcmd DUdata UMdata.

As long as all permutations of the rule are specified, the stack-based approach is able to handle the different situations.

A set of rules and actions to detect an incorrect signal assertion or de-assertion can be created. Garbage collection rules can be used to detect invalid opcodes, invalid signal values during reset and hanging signals. These rules can be useful in increasing the coverage of the checks and can be extended to include all signals.

The foregoing techniques can be implemented in a program executable on a computer system. The program can be stored on a storage medium readable by a general or special purpose programmable computer system. The storage medium is read by the computer system to perform the functions described above.

The invention can also be implemented using digital logic hardware.

Other implementations are within the scope of the following claims.

What is claimed is:

1. A method comprising:
   generating simulation signals from a design simulation;
   applying a transaction rule to recognize a first set of the simulation signals as a transaction;
   applying an atomic rule to recognize a second set of the simulation signals;
   applying a non-atomic rule to recognize a first set of atomic rules; and
   executing an action associated with the transaction rule.

2. The method according to claim 1 further comprising:
   successively defining the transaction rule using other rules so that the transaction rule is defined by the simulation signals.

3. The method according to claim 2 further comprising:
   executing an action associated with each rule to perform user-defined functions.

4. The method according to claim 1 further comprising:
   applying the transaction rule to recognize a second set of atomic rules and a set of non-atomic rules as the transaction corresponding to the transaction rule.

5. The method according to claim 1 further comprising:
   placing in a data structure one or more symbols corresponding to an atomic rule associated with the simulation signals;
   replacing in the data structure one or more symbols corresponding to atomic rules with one or more symbols corresponding to a non-atomic rule; and
   replacing one or more symbols corresponding to non-atomic rules and one or more symbols corresponding to atomic rules with one or more symbols corresponding to the transaction rule.

6. The method according to claim 1 further comprising:
   producing an output which includes printing information about the transaction.

7. A method comprising:
   defining a transaction rule, which is associated with a first action, by non-atomic rules, each of which is associated with a second action and is defined by one or more atomic rules, wherein each atomic rule is associated with a third action and is defined in terms of one or more simulation signals; and
   executing each of the first, second, and third action for performing user-defined functions.

8. The method according to claim 7 further comprising:
   placing in a data structure a symbol corresponding to an atomic rule associated with the simulation signals;
   replacing in the data structure one or more symbols corresponding to atomic rules with a symbol corresponding to a non-atomic rule; and
   replacing one or more symbols corresponding to non-atomic rules and one or more symbols corresponding to atomic rules with a symbol corresponding to the transaction rule.

9. The method according to claim 7 further comprising:
   defining another transaction rule to recognize a permutation of the atomic rules as the transaction.

10. An article comprising a computer-readable medium that stores computer-executable instructions for causing a computer system to:
    generate simulation signals from a design simulation;
    apply a transaction rule to recognize a set of the simulation signals as a transaction;
    apply an atomic rule to recognize a second set of the simulation signals;
    apply a non-atomic rule to recognize a first set of atomic rules; and
    execute an action associated with the transaction rule.

11. The article according to claim 10 further including instruction for causing the computer system to:
    successively define the transaction rule with other rules so that the transaction rule is defined by the simulation signals.

12. The article according to claim 11 further including instruction for causing the computer system to:
    execute an action associated with each rule to perform user-defined functions.

13. The article according to claim 10 further including instruction for causing the computer system to:
    apply the transaction rule to recognize a second set of atomic rules and a set of non-atomic rules as the transaction corresponding to the transaction rule.

14. The article according to claim 10 further including instruction for causing the computer system to:
    place in a data structure a symbol corresponding to an atomic rule associated with the simulation signals;
    replace in the data structure one or more symbols corresponding to atomic rules with a symbol corresponding to a non-atomic rule; and
    replace one or more symbols corresponding to non-atomic rules and one or more symbols corresponding to atomic rules with a symbol corresponding to the transaction rule.

15. The article according to claim 10 further including instruction for causing the computer system to:

print information about the transaction as an output.

16. An article comprising a computer-readable medium that stores computer-executable instructions for causing a computer system to:
   define a transaction rule, which is associated with a action, by non-atomic rules, each of which is associated with an action and is defined by one or more atomic rules, wherein each atomic rule is associated with an action and is defined in terms of one or more simulation signals; and
   execute each of the first, secord, and third action to perform user-defined functions.

17. The article according to claim 16 further including instruction for causing the computer system to:
   place in a data structure a symbol corresponding to an atomic rule associated with the simulation signals;
   replace in the data structure one or more symbols corresponding to atomic rules with a symbol corresponding to a non-atomic rule; and
   replace one or more symbols corresponding to non-atomic rules and one or more symbols corresponding to atomic rules with a symbol corresponding to the transaction rule.

18. The article according to claim 16 further including instruction for causing the computer system to:
   define another transaction rule to recognize a permutation of the atomic rules as the transaction.

19. An apparatus comprising:
   a computerized simulator to generate simulation signals from a design simulation; and
   a processor configured to:
   apply a transaction rule to recognize a first set of the simulation signals as a transaction;
   apply an atomic rule to recognize a second set of the simulation signals;
   apply a non-atomic rule to recognize a first set of atomic rules; and
   execute an action associated with the transaction rule to produce an output identifying the transaction.

20. The apparatus according to claim 19 wherein the processor is further configured to:
   successively define the transaction rule with other rules so that the transaction rule is defined by the simulation signals.

21. The apparatus according to claim 20 wherein the processor is further configured to:
   execute an action associated with each rule to perform user-defined functions.

22. The apparatus according to claim 19 wherein the processor is further configured to:
   apply the transaction rule to recognize a second set of atomic rules and a set of non-atomic rules as the transaction corresponding to the transaction rule.

23. The apparatus according to claim 19 wherein the processor is further configured to:
   place in a data structure a symbol corresponding to an atomic rule associated with the simulation signals;
   replace in the data structure one or more symbols corresponding to atomic rules with a symbol corresponding to a non-atomic rule; and
   replace one or more symbols corresponding to non-atomic rules and the one or more symbols corresponding to atomic rules with a symbol corresponding to the transaction rule.

24. The apparatus according to claim 19 wherein the processor is further configured to:
   print out information about the transaction as an output.

25. An apparatus comprising:
   a computerized simulator for generating simulation signals from a design simulation; and
   a processor configured to:
   define a transaction rule, which is associated with a first action, by non-atomic rules, each of which is associated with an action and is defined by one or more atomic rules;
   wherein each atomic rule is associated with a third action and is defined in terms of one or more simulation signals; and
   execute each of the first, second, and third action to perform user-defined functions.

26. The apparatus according to claim 25 wherein the processor is further configured to:
   place in a data structure a symbol corresponding to an atomic rule associated with the simulation signals;
   replace in the data structure one or more symbols corresponding to atomic rules with a symbol corresponding to a non-atomic rule; and
   replace one or more symbols corresponding to non-atomic rules and one or more symbols corresponding to atomic rules with a symbol corresponding to the transaction rule.

27. The apparatus according to claim 25 wherein the processor is further configured to:
   define another transaction rule to recognize a permutation of the atomic rules as the transaction.

* * * * *

UNITED STATES PATENT AND TRADEMARK OFFICE
CERTIFICATE OF CORRECTION

PATENT NO. : 6,993,468 B2
APPLICATION NO. : 09/750233
DATED : January 31, 2006
INVENTOR(S) : Harriman et al.

It is certified that error appears in the above-identified patent and that said Letters Patent is hereby corrected as shown below:

In column 5, line 65, in Claim 5, after "structure" insert -- the --.

In column 6, line 1, in Claim 5, after "replacing" insert -- the --.

In column 6, line 2, in Claim 5, after "and" insert -- the --.

In column 6, line 34, in Claim 10, after "recognize a" insert -- first --.

In column 6, line 57, in Claim 14, after "structure" delete "a" and insert -- one or more --, therefor.

In column 6, line 57, in Claim 14, delete "symbol" and insert -- symbols --, therefor.

In column 6, line 59, in Claim 14, after "structure" insert -- the --.

In column 6, line 60, in Claim 14, delete "a" and insert -- one or more --, therefor.

In column 6, line 60, in Claim 14, before "corresponding" delete "symbol" insert -- symbols --, therefor.

In column 6, line 62, in Claim 14, after "replace" insert -- the --.

In column 6, line 63, in Claim 14, after "and" insert -- the --.

In column 6, line 64, in Claim 14, delete "a symbol" and insert -- one or more symbols --, therefor.

UNITED STATES PATENT AND TRADEMARK OFFICE
CERTIFICATE OF CORRECTION

PATENT NO. : 6,993,468 B2  
APPLICATION NO. : 09/750233  
DATED : January 31, 2006  
INVENTOR(S) : Harriman et al.

It is certified that error appears in the above-identified patent and that said Letters Patent is hereby corrected as shown below:

In column 7, line 5, in Claim 16, after "with a" insert -- first --.

Signed and Sealed this

Second Day of October, 2007

JON W. DUDAS  
*Director of the United States Patent and Trademark Office*